United States Patent
Ohashi

(10) Patent No.: US 8,248,539 B2
(45) Date of Patent: Aug. 21, 2012

(54) CHANNEL SELECTING DEVICE, CHANNEL SELECTING METHOD, AND PROGRAM

(75) Inventor: Yoshiyuki Ohashi, Saitama (JP)

(73) Assignee: Sony Corporation, Tokyo (JP)

( * ) Notice: Subject to any disclaimer, the term of this patent is extended or adjusted under 35 U.S.C. 154(b) by 383 days.

(21) Appl. No.: 12/610,510

(22) Filed: Nov. 2, 2009

(65) Prior Publication Data

US 2010/0123833 A1    May 20, 2010

(30) Foreign Application Priority Data

Nov. 19, 2008    (JP) ................. 2008-295521

(51) Int. Cl.
*H04N 5/50* (2006.01)
*H04N 5/455* (2006.01)

(52) U.S. Cl. .............. 348/732; 348/731; 348/726

(58) Field of Classification Search .......... 348/731–733, 348/726, 727; 455/173.1, 179.1, 182.1–182.3, 455/190.1, 192.1–192.3, 337; 329/300, 301, 329/302, 315, 323; *H04N 5/50, 5/455*
See application file for complete search history.

(56) References Cited

U.S. PATENT DOCUMENTS

| | | |
|---|---|---|
| 4,422,096 A | 12/1983 | Henderson |
| 4,594,611 A | 6/1986 | Sugibayashi et al. |
| 4,868,892 A | 9/1989 | Tults et al. |
| 6,252,634 B1 * | 6/2001 | Yuen et al. ............ 348/731 |
| 6,542,203 B1 * | 4/2003 | Shadwell et al. ......... 348/731 |

FOREIGN PATENT DOCUMENTS

| | | |
|---|---|---|
| EP | 0 875 993 A2 | 11/1998 |
| EP | 0 875 993 A3 | 11/1998 |
| JP | 56-8919 | 1/1981 |
| JP | 5-110385 | 4/1993 |
| JP | 6-314958 | 11/1994 |
| JP | 7-131725 | 5/1995 |
| JP | 7-131726 | 5/1995 |
| JP | 2000-69385 | 3/2000 |
| JP | 3090315 | 7/2000 |

OTHER PUBLICATIONS

Office Action issued Sep. 14, 2010, in Japanese Patent Application No. 2008-295521.

* cited by examiner

*Primary Examiner* — Sherrie Hsia
(74) *Attorney, Agent, or Firm* — Oblon, Spivak, McClelland, Maier & Neustadt, L.L.P.

(57) ABSTRACT

A channel selecting device includes: a tuner unit selecting a broadcast wave signal of a channel-selection frequency corresponding to supplied frequency information and frequency-converting the broadcast wave signal into an intermediate frequency signal; and a demodulation unit checking whether a desired carrier exists on the basis of the intermediate frequency signal from the tuner unit, setting a carrier frequency as the channel-selection frequency when checking that the desired carrier exists, performing a first process of determining whether a current zone is a zone of which a frequency should be set lower than the channel-selection frequency so as to raise the channel-selection frequency and a second process of determining whether the current zone is a zone of which a frequency should be set higher than the channel-selection frequency so as to lower the channel-selection frequency, and setting the channel-selection frequency as a target just-tuning frequency.

7 Claims, 3 Drawing Sheets

CHANNEL SELECTING DEVICE, CHANNEL SELECTING METHOD, AND PROGRAM

BACKGROUND OF THE INVENTION

1. Field of the Invention

The present invention relates to a channel selecting device, a channel selecting method, and a program, which can be used in a television set.

2. Description of the Related Art

For example, there is a method of controlling the tuning (channel selection) with a tuner circuit in a television receiver by the use of a voltage synthesizer circuit.

When the tuning (channel selection) with the tuner circuit is controlled by the use of a voltage synthesizer circuit, a channel selection control circuit performing an automatic frequency tuning (AFT) operation in a digital manner to perform the optimal AFT operation has been suggested (for example, see Japanese Unexamined Patent Application Publication Nos. 7-131725 and 7-131726).

SUMMARY OF THE INVENTION

However, the past channel selecting operation has the following problem when searching for the channel-selection frequency in automatic scanning.

Since a dead zone of the AFT operation has a certain width, the channel-selection frequency is slightly deviated from the just-tuning frequency, which causes the frequency characteristic (f characteristic) of a video to differ.

When a carrier is captured at a frequency greatly deviated from the dead zone of the AFT during searching carriers and the channel selecting process is performed on the carrier, a control should be made using an AFT voltage and thus a control time in a channel selecting algorithm may increase.

When it is tried to directly control the tuning operation using a frequency instead of the AFT voltage, a large-scale circuit such as an analogue-to-digital (A/D) converter is added, which raises the cost, and further the frequency control may not be accurate enough, which is not desirable.

Since a video capture range is narrow, it is necessary to perform a fine control.

It is desirable to provide a channel selecting device, a channel selecting method, and a program, which can set a channel-selection frequency as a just-tuning frequency without complicated frequency control.

According to an embodiment of the invention, there is provided a channel selecting device including: a tuner unit performing an automatic scanning process of scanning carrier signals while sequentially shifting a channel-selection frequency in a predetermined frequency range, selecting a broadcast wave signal of the channel-selection frequency corresponding to supplied frequency information, and frequency-converting the broadcast wave signal into an intermediate frequency signal; and a demodulation unit receiving the intermediate frequency signal from the tuner unit, checking whether a desired carrier exists, setting a carrier frequency as the channel-selection frequency when it is checked that the desired carrier exists, performing a first process of determining whether a current zone is a zone of which a frequency should be set lower than the channel-selection frequency so as to raise the channel-selection frequency and a second process of determining whether the current zone is a zone of which a frequency should be set higher than the channel-selection frequency so as to lower the channel-selection frequency, and setting the channel-selection frequency as a target just-tuning frequency.

According to another embodiment of the invention, there is provided a channel selecting method including the steps of: allowing a tuner unit, which performs an automatic scanning process of scanning carrier signals while sequentially shifting a channel-selection frequency in a predetermined frequency range, to select a broadcast wave signal of the channel-selection frequency corresponding to supplied frequency information and to frequency-convert the broadcast wave signal into an intermediate frequency signal; setting a carrier frequency as the channel-selection frequency when it is checked that a desired carrier exists on the basis of the intermediate frequency signal; performing a first process of determining whether a current zone is a zone of which a frequency should be set lower than the channel-selection frequency so as to raise the channel-selection frequency and a second process of determining whether the current zone is a zone of which a frequency should be set higher than the channel-selection frequency so as to lower the channel-selection frequency; and setting the channel-selection frequency as a target just-tuning frequency after the processes.

According to further another embodiment of the invention, there is provided a program allowing a computer to execute a channel selecting method including the steps of: allowing a tuner unit, which performs an automatic scanning process of scanning carrier signals while sequentially shifting a channel-selection frequency in a predetermined frequency range, to select a broadcast wave signal of the channel-selection frequency corresponding to supplied frequency information and to frequency-convert the broadcast wave signal into an intermediate frequency signal; setting a carrier frequency as the channel-selection frequency when it is checked that a desired carrier exists on the basis of the intermediate frequency signal; performing a first process of determining whether a current zone is a zone of which a frequency should be set lower than the channel-selection frequency so as to raise the channel-selection frequency and a second process of determining whether the current zone is a zone of which a frequency should be set higher than the channel-selection frequency so as to lower the channel-selection frequency; and setting the channel-selection frequency as a target just-tuning frequency after the processes.

According to the above-mentioned embodiments of the invention, the demodulation unit sets the carrier frequency as the channel-selection frequency when checking that the desired carrier exists on the basis of the intermediate frequency signal supplied from the tuner unit.

The demodulation unit performs both the first process of determining whether the current zone is a zone of which the frequency should be set lower than the channel-selection frequency so as to raise the channel-selection frequency and the second process of determining whether the current zone is a zone of which the frequency should be set higher than the channel-selection frequency so as to lower the channel-selection frequency.

After the processes are ended, the channel-selection frequency is set as the target just-tuning frequency.

According to the above-mentioned embodiments, it is possible to set the channel-selection frequency as the just-tuning frequency without complicated frequency control.

DESCRIPTION OF THE PREFERRED EMBODIMENTS

Hereinafter, preferred embodiments of the invention will be described with reference to the accompanying drawings.

The description is made in the following order:
1. Configuration Example of Channel Selecting Device;
2. Concept of Channel Selecting Operation of Channel Selecting Device; and
3. Operation Example of Channel Selecting Device.

1. Configuration Example of Channel Selecting Device

Figure 1:
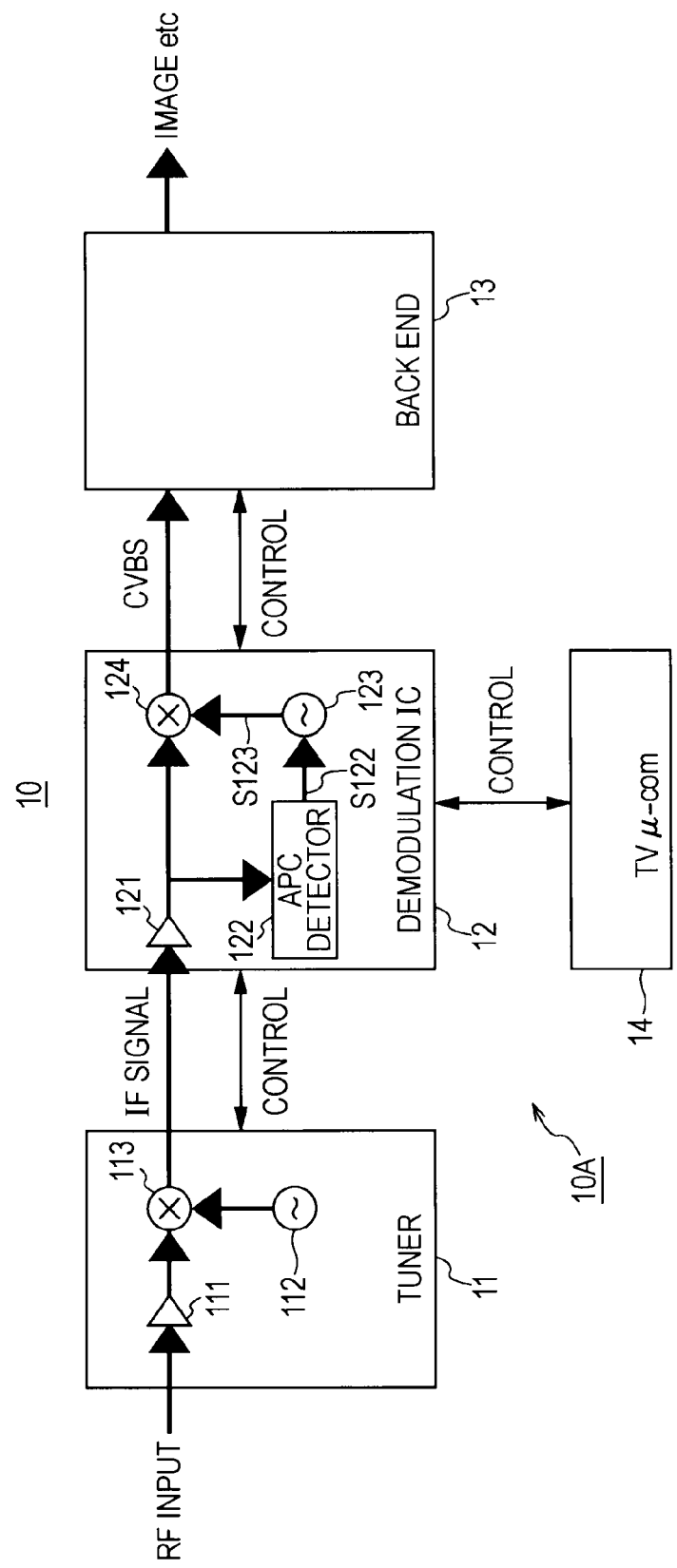
FIG. 1 is a block diagram illustrating the configuration of a broadcast receiver employing a channel selecting device according to an embodiment of the invention.

FIG. 1 is a block diagram illustrating an example of the configuration of a broadcast receiver employing a channel selecting device according to an embodiment of the invention.

The broadcast receiver 10 includes a tuner circuit 11, a demodulation circuit 12, a backend unit 13, and a micro computer (μ-com) 14.

The tuner circuit 11, the demodulation circuit 12, and the micro computer 14 constitute a channel selecting device 10A.

The tuner circuit 11 selects a broadcast wave signal of a frequency f (channel) corresponding to the magnitude of a supplied tuning voltage (supplied frequency information), frequency-converts the selected broadcast wave signal into an intermediate frequency signal (IF signal), and outputs the intermediate frequency signal to the demodulation circuit 12.

The tuner circuit 11 has a function of tuning a frequency to the frequency corresponding to the frequency information supplied from the demodulation circuit 12.

The tuner circuit 11 performs an automatic scanning process of repeatedly performing a scanning operation of searching for a carrier signal from an initial frequency f=40.0 MHz to 860 MHz every predetermined frequency unit, for example, every 2 MHz. This frequency setting is carried out, for example, under the control of the demodulation circuit 12.

The tuner circuit 11 generates the IF signal by a mixing process at the frequency f corresponding to the frequency information supplied from the demodulation circuit 12 and outputs the generated IF signal to the demodulation circuit 12.

Basically, the operation of the tuner circuit 11 is performed under the control of the demodulation circuit 12 controlled by the micro computer 14.

The conceptual basic configuration of the tuner circuit 11 is shown in FIG. 1.

The tuner circuit 11 includes an AGC amplifier 111, a local oscillator 112, and a mixer 113.

The AGC amplifier 111 amplifies an input RF signal with a predetermined gain and outputs the amplified RF signal to the mixer 113.

The AGC amplifier 111 is controlled to amplify the RF signal with a reduced sensitivity, for example, at the time of scanning.

The local oscillator 112 generates a locally-oscillated signal LO of a predetermined frequency and outputs the generated locally-oscillated signal to the mixer 113.

The mixer 113 performs a process (multiplication process) of mixing the input RF signal (broadcast wave signal) with the locally-oscillated signal LO to generate an IF signal and outputs the generated IF signal to the demodulation circuit 12.

The demodulation circuit 12 sets the carrier frequency as the channel-selection frequency when checking that a desired carrier exists on the basis of the intermediate frequency signal supplied from the tuner circuit 11.

The demodulation circuit 12 performs both of a first process of determining whether a current zone is a zone of which the frequency should be set lower than the channel-selection frequency so as to raise the channel-selection frequency and a second process of determining whether the current zone is a zone of which the frequency should be set higher than the channel-selection frequency so as to lower the channel-selection frequency.

The demodulation circuit 12 sets the channel-selection frequency as a target just-tuning frequency after the end of processes.

The demodulation circuit 12 determines whether the desired carrier signal exists on the basis of the output signal supplied from the tuner circuit 11, locks the PLL circuit when the desired carrier signal is searched out, and shifts the frequency to the vicinity of the frequency of the desired carrier (just-tuning frequency) $f_0$.

The demodulation circuit 12 sets the frequency obtained by subtracting a predetermined frequency of 281.25 kHz from the current just-tuning frequency $f_0$, for example, so as to make AFT UP, and sends the frequency information to the tuner circuit 11.

The demodulation circuit 12 shifts the frequency to the just-tuning frequency $f_0$ by, for example, +62.5 kHz until two times of AFT UP are made. The frequency is repeatedly shifted by a predetermined number of times, for example, 10 times.

The demodulation circuit 12 shifts the frequency from the just-tuning frequency $f_0$ by, for example, +2 MHz when it is finally determined in the repeated processes that AFT UP is not made.

When it is determined that AFT UP is made by the repeated processes, the demodulation circuit 12 sets the frequency obtained by adding a predetermined frequency of 281.25 kHz to the current just-tuning frequency $f_0$, for example, so as to make AFT DN (down), and sends the frequency information to the tuner circuit 11.

The demodulation circuit 12 shifts the frequency to the just-tuning frequency $f_0$ by, for example, −62.5 kHz until two times of AFT DN are made. The frequency is repeatedly shifted by a predetermined number of times, for example, 10 times.

The demodulation circuit 12 shifts the frequency from the just-tuning frequency $f_0$ by, for example, +2 MHz when it is finally determined in the repeated processes that AFT DN is not made.

The conceptual basic configuration of the demodulation circuit 12 is shown in FIG. 1.

The demodulation circuit 12 includes an amplifier 121, an APC (Automatic Phase Control) detector 122, a voltage-controlled oscillator (VCO) 123, and a mixer 124.

The amplifier 121 amplifies the IF signal supplied from the tuner circuit 11 and outputs the amplified IF signal to the mixer 124.

The APC detector 122 serves as an PLL circuit and supplies a voltage signal S122, in which a reference signal and the IF signal are synchronized in phase with each other, to the VCO 123.

The VCO 123 oscillates at the frequency corresponding to the voltage signal S122 from the APC detector 122 and outputs an oscillated signal S123 to the mixer 124.

The mixer 124 performs a process (multiplication process) of mixing the oscillated signal S123 of the VCO 123 with the amplified IF signal to generate a reproduced signal and outputs the reproduced signal to the backend unit 13.

The demodulation circuit 12 separates data of the channel selected as described above into, for example, video data and audio data and performs a demodulation process on the video data and the audio data.

The video data was modulated in an AM manner. The demodulation circuit 12 demodulates the supplied video data by a demodulation method corresponding to the modulated video data.

The audio data was modulated in an FM or AM manner. The demodulation circuit 12 demodulates the supplied audio data by a demodulation method corresponding to the modulated audio data.

The demodulation circuit 12 supplies the demodulated data to the backend unit 13.

The backend unit 13 receives television data demodulated by the demodulation circuit 12, generates analog video and audio signals, and outputs the generated video and audio signals. The video signal is supplied to, for example, a video amplifier.

The video signal processed by the backend unit 13 is displayed on a display device not shown and the audio signal is output from a speaker.

The micro computer 14 controls the entire broadcast receiver 10.

The micro computer 14 controls a process of setting an automatic scanning frequency in the demodulation circuit 12, or the like.

2. Concept of Channel Selecting Operation of Channel Selecting Device

The concept of the channel selecting operation of the channel selecting device according to the embodiment of the invention will be described now in comparison with the past channel selecting operation.

Figure 2:
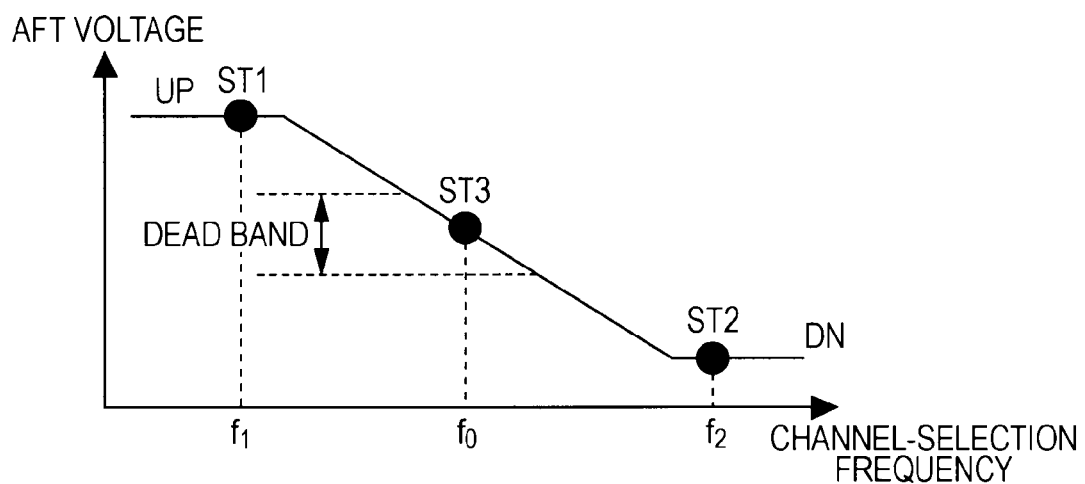
FIG. 2 is a diagram illustrating the concept of a channel selecting operation of the channel selecting device according to the embodiment of the invention.

FIG. 2 is a diagram illustrating the concept of the channel selecting operation of the channel selecting device according to the embodiment of the invention.

Figure 3:
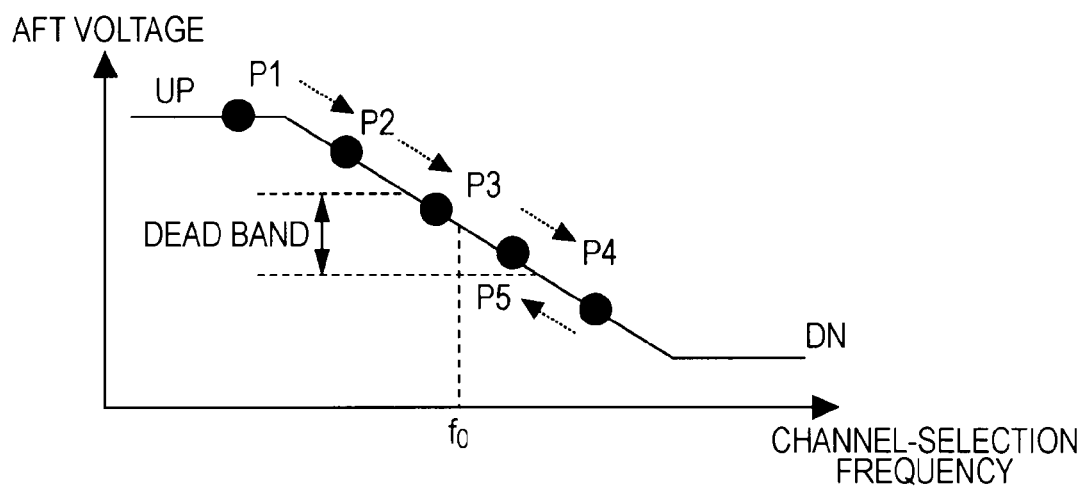
FIG. 3 is a diagram illustrating the existing concept of a channel selecting operation.

FIG. 3 is a diagram illustrating the existing concept of the channel selecting operation.

First, the concept of the channel selecting operation will be described with reference to FIG. 3.

In this example, when a desired carrier is searched out, the PLL of the demodulation circuit is locked and the channel-selection frequency is shifted to a point P1 in the vicinity of the frequency (just-tuning frequency) $f_0$ of the desired carrier.

At this time, it is not seen by what degree the frequency is deviated from the just-tuning frequency, but it can be determined using the AFT voltage whether the channel-selection frequency should be raised (shifted up (UP)) or lowered (shifted down (DN)) to approach $f_0$.

The gap between the maximum value and the minimum value of the AFT voltage is divided into three parts and one of three operations of shifting up (the AFT voltage is high), stopping (the AFT voltage is middle (dead zone), and shifting down (the AFT voltage is low) the channel-selection frequency is performed depending on what zone of high, middle, and low zones the AFT voltage belongs to.

At the point P1, the AFT voltage is at a high level and it is controlled to raise the channel-selection frequency.

When the frequency is raised, the AFT voltage is lowered from the point P1 to P2 and from the point P2 to P3 and thus enters the dead zone.

In the dead zone, it is considered that the channel-selection frequency is not exactly equal to the just-tuning frequency but is close to the just-tuning frequency.

Then, the channel-selection frequency is raised until the DN zone appears. The passing of the dead zone is carried out to check the existence of an S curve of the AFT, which enhances the reliability of the channel selection.

When the channel-selection frequency is raised to the point P4 and it is determined that the DN zone appears, it is controlled to lower the channel-selection frequency, the frequency is lowered up to the point P5, and the channel selecting operation is finished in the dead zone.

The dead zone has a bandwidth of about 100 kHz.

However, the above-mentioned method has the following disadvantages.

Since a dead zone of the AFT operation has a certain width, the channel-selection frequency is slightly deviated from the just-tuning frequency, which causes the frequency characteristic (f characteristic) of a video to differ.

When a carrier is captured at a frequency greatly deviated from the dead zone of the AFT during searching carriers and the channel selecting process is performed on the carrier, a control should be made using an AFT voltage and thus a control time in a channel selecting algorithm may increase.

When it is tried to directly control the tuning operation using a frequency instead of the AFT voltage, a large-scale circuit such as an analogue-to-digital (A/D) converter is added, which raise the cost, and further the frequency control may not be accurate enough, which is not desirable.

Since a video capture range is narrow, it is necessary to perform a fine control.

Therefore, in this embodiment, the method shown in FIGS. 2 and 4 to be described later in detail is employed.

The concept of the channel selecting operation of the channel selecting device according to this embodiment will be described now with reference to FIG. 2.

In the channel selecting operation of the broadcast receiver 10 according to this embodiment, when the desired carrier is searched out and the PLL is locked, it can be seen to what degree the frequency is deviated from the frequency (just-tuning frequency) $f_0$ of the desired carrier.

In this embodiment, when the frequency $f_0$ is acquired, the channel-selection frequency is not right set to the frequency $f_0$, but the channel-selection frequency is first set to the frequency $f_1$ (step ST1) lower than the frequency $f_0$ by 281.25 kHz and it is then checked that it moves up.

Then, the channel-selection frequency is set to the frequency $f_2$ (step ST2) higher than the frequency $f_0$ by 281.25 kHz, it is checked that it moves down, and then the channel-selection frequency is set as the just-tuning frequency of step ST3 which is the target point, whereby the channel selection is finished.

When it is assumed that the reliability of the function of obtaining the frequency $f_0$ is very high, a control method of directly performing the process of step ST3 without performing the processes of steps ST1 and ST2 may be employed, thereby further speeding up the searching for the channel-selection frequency in comparison with the above-mentioned method.

According to this embodiment, it is possible to reduce the time to finish the channel selection and to simplify the control process.

3. Operation Example of Channel Selecting Device

A specific channel selecting operation of the broadcast receiver 10 according to this embodiment will be described now with reference to FIG. 4. The description is centered on the processes of the tuner circuit 11 and the demodulation circuit 12.

Figure 4:
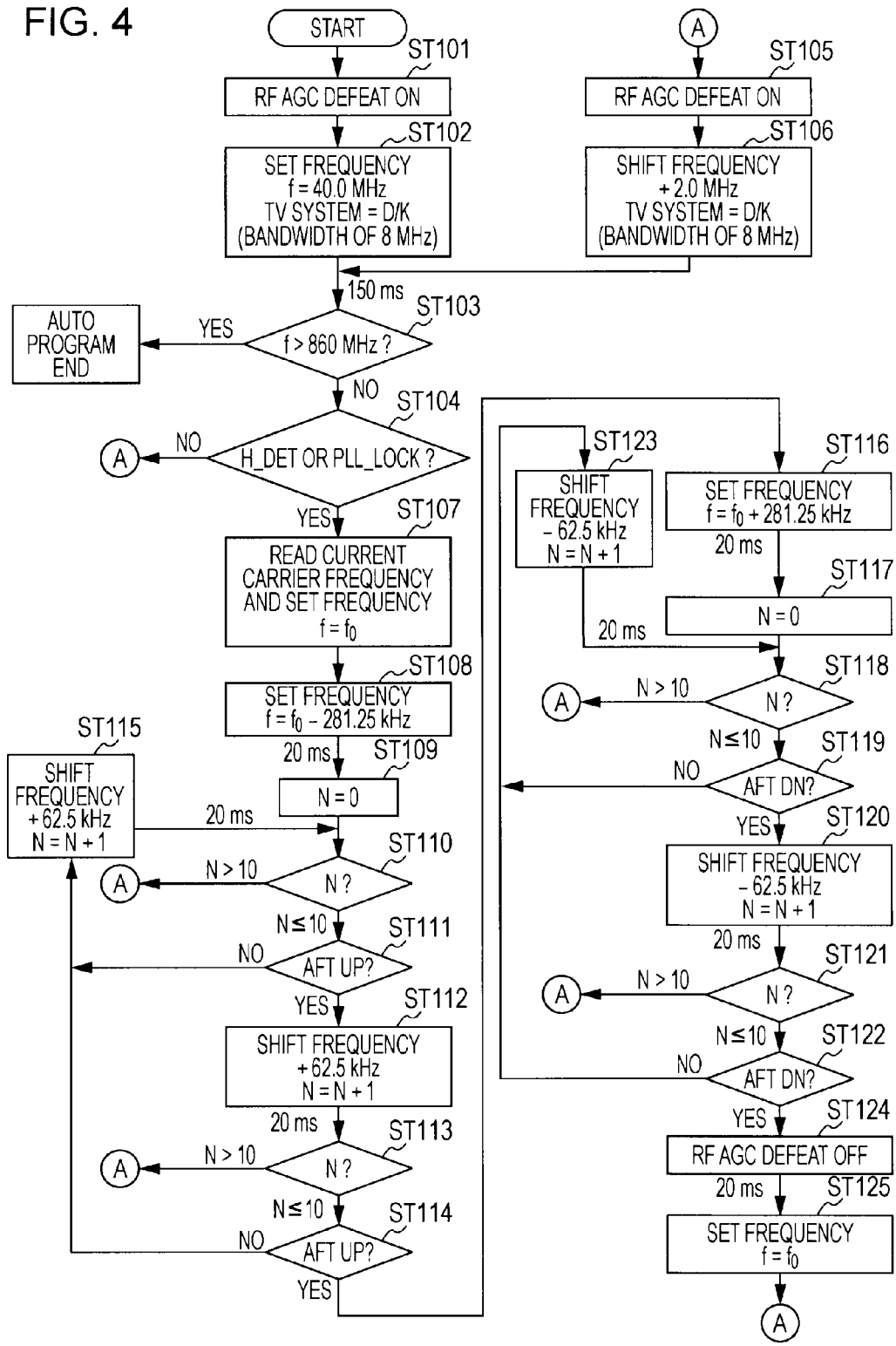
FIG. 4 is a flowchart illustrating the specific channel selecting operation of a broadcast receiver according to the embodiment of the invention.

FIG. 4 is a flowchart illustrating the specific channel selecting operation of the broadcast receiver 10 according to this embodiment.

Step ST101

First, in step ST101, it is controlled to reduce the sensitivity of the AGC amplifier 111 of the tuner circuit 11 (the control is turned on).

Step ST102

In step ST102, the automatic scanning frequency f in the tuner circuit 11 is set to the initial value of 40.0 MHz. In this case, the bandwidth of the tuner is 8 MHz.

The tuner circuit 11 repeatedly performs a scanning operation of searching for a carrier signal from the initial frequency of f=40.0 MHz to 860 MHz every predetermined frequency unit, for example, every 2 MHz.

Step ST103

In step ST103, it is determined whether the frequency f is greater than 860 MHz.

When it is determined in step ST103 that the frequency f is greater than 860 MHz, the automatic scanning process is ended.

Step ST104

In step ST104, it is determined whether a desired carrier signal exists on the basis of the IF signal supplied from the tuner circuit 11 or whether the PLL of the APC detector 122 is locked.

When it is determined in step ST104 that the desired carrier signal does not exist or that the PLL is not locked, the process of step ST105 is performed.

On the other hand, when it is determined in step ST104 that the desired carrier signal exists or that the PLL is locked, the process of step ST107 is performed.

Step ST105

In step ST105, similarly to step ST101, it is controlled to reduce the sensitivity of the AGC amplifier 111 of the tuner circuit 11.

Step ST106

In step ST106, +2 MHz is added to the frequency to which the automatic scanning frequency f is already set in the tuner circuit 11 and then the process of step ST103 is repeated.

As described above, the tuner circuit 11 repeatedly performs a scanning operation of searching for a carrier signal from the initial frequency of f=40.0 MHz to 860 MHz every predetermined frequency unit, for example, every 2 MHz.

Step ST107

In step ST107, the demodulation circuit 12 reads the current carrier frequency as the just-tuning frequency $f_0$ and the scanning frequency f of the tuner circuit 11 is set to the frequency $f_0$.

Step ST108

In step ST108, the demodulation circuit 12 sets the channel-selection frequency f of the tuner circuit 11 to a frequency, which is obtained by subtracting a predetermined frequency of 281.25 kHz from the current just-tuning frequency $f_0$, so as to make AFT UP.

Step ST109

In step ST109, the number of repetitions N is set to an initial value "0".

Step ST110

In step ST110, it is determined whether the number of repetitions N is greater than 10.

When it is determined in step ST110 that the number of repetitions N is greater than 10, the process of step ST105 is repeated and the processes of steps ST105 to ST109 are performed again.

When it is determined in step ST110 that the number of repetitions N is not greater than 10, the process of step ST111 is performed.

Step ST111

In step ST111, it is determined whether AFT UP is made.

When it is determined in step ST111 that AFT UP is made, the process of step ST112 is performed.

When it is determined in step ST111 that AFT UP is not made, the process of step ST115 is performed.

Step ST112

In step ST112, the frequency f is shifted to the just-tuning frequency $f_0$, for example, 62.5 kHz is added thereto, and the number of repetitions N increases by +1.

Step ST113

In step ST113, it is determined whether the number of repetitions N is greater than 10.

When it is determined in step ST113 that the number of repetitions N is greater than 10, the process of step ST105 is repeated and the processes of steps ST105 to ST112 are performed again.

When it is determined in step ST113 that the number of repetitions N is not greater than 10, the process of step ST114 is performed.

Step ST114

In step ST114, it is determined whether AFT UP is made.

When it is determined in step ST114 that AFT UP is not made, the process of step ST115 is performed.

When it is determined in step ST114 that AFT UP is made, the process of step ST116 is performed.

Step ST115

In step ST115, the frequency f is shifted to the just-tuning frequency $f_0$, for example, 62.5 kHz is added thereto, and the number of repetitions N increases by +1.

Then, the process of step ST110 is performed again.

Step ST116

When it is determined in the above-mentioned repeated processes that AFT UP is made, the processes from step ST116 are performed.

First, in step ST116, the demodulation circuit 12 sets the channel-selection frequency f of the tuner circuit 11 to a frequency, which is obtained by adding a predetermined frequency of 281.25 kHz to the current just-tuning frequency $f_0$, so as to make AFT DN.

Step ST117

In step ST117, the number of repetitions N is set to an initial value "0".

Step ST118

In step ST118, it is determined whether the number of repetitions N is greater than 10.

When it is determined in step ST118 that the number of repetitions N is greater than 10, the process of step ST105 is repeated and the processes of steps ST105 to ST117 are performed again.

When it is determined in step ST118 that the number of repetitions N is not greater than 10, the process of step ST119 is performed.

Step ST119

In step ST119, it is determined whether AFT DN is made.

When it is determined in step ST119 that AFT DN is made, the process of step ST120 is performed.

When it is determined in step ST119 that AFT DN is not made, the process of step ST123 is performed.

Step ST120

In step ST120, the frequency f is shifted to the just-tuning frequency $f_0$, for example, 62.5 kHz is subtracted therefrom, and the number of repetitions N increases by +1.

Step ST121

In step ST121, it is determined whether the number of repetitions N is greater than 10.

When it is determined in step ST121 that the number of repetitions N is greater than 10, the process of step ST105 is repeated and the processes of steps ST105 to ST120 are performed again.

When it is determined in step ST121 that the number of repetitions N is not greater than 10, the process of step ST122 is performed.

Step ST122

In step ST122, it is determined whether AFT DN is made.

When it is determined in step ST122 that AFT DN is not made, the process of step ST123 is performed.

When it is determined in step ST122 that AFT DN is made, the process of step ST124 is performed.

Step ST123

In step ST123, the frequency f is shifted to the just-tuning frequency $f_0$, for example, 62.5 kHz is subtracted therefrom, and the number of repetitions N increases by +1.

Then, the process of step ST118 is performed again.

Step ST124

In step ST124, the control for reducing the sensitivity of the AGC amplifier 111 of the tuner circuit 11 is stopped (the control is turned off).

Step ST125

In step ST125, the frequency f is set to the just-tuning frequency $f_0$.

In the above description, the first process of steps ST108 to ST115 for AFT UP is first performed and the second process of steps ST116 to ST123 for AFT DN is then performed. However, the order of processes may be reversed.

That is, the second process of steps ST116 to ST123 for AFT DN may be first performed and the first process of steps ST108 to ST115 for AFT UP may be then performed.

In the above-mentioned broadcast receiver 10 according to this embodiment, the demodulation circuit 12 sets the carrier frequency as the channel-selection frequency when checking that a desired carrier exists on the basis of the intermediate frequency signal supplied from the tuner circuit 11.

The demodulation circuit 12 performs both of a first process of determining whether a current zone is a zone of which the frequency should be set lower than the channel-selection frequency so as to raise the channel-selection frequency and a second process of determining whether the current zone is a zone of which the frequency should be set higher than the channel-selection frequency so as to lower the channel-selection frequency.

The demodulation circuit 12 sets the channel-selection frequency as a target just-tuning frequency after the end of processes.

Therefore, according to this embodiment, the following advantages can be obtained.

When carriers are often captured at a frequency greatly deviated from the dead zone of the AFT in searching for carriers, it is possible to make a frequency control with high precision and by a small number of times, thereby greatly reducing the time of automatic scanning.

Since the channel can be selected not using the edge of the dead zone but using the just-tuning frequency, the f characteristic of the video is prevented from deviation and the video characteristic is optimized.

It is possible to greatly reduce the number of processes for development and verification of software (S/W) due to the clarification of the channel selecting algorithm.

That is, according to this embodiment, when the PLL is locked for the desired carrier, the just-tuning frequency can be easily acquired by the demodulation circuit 12. Accordingly, it is possible to set the channel-selection frequency to the just-tuning frequency without complicated frequency control.

The just-tuning frequency can be easily acquired, because the signal in the IC is not processed by analog but by digital, which is suitable for numerical expression.

It is possible to make the most use of the characteristic that the video capture range is wide and to make a control using a simpler channel selecting algorithm.

In the channel selecting algorithm according to the embodiment of the invention, it is possible to reduce the time of frequency control and particularly to reduce the time of automatic scanning.

The above-mentioned method can be constructed by a program corresponding to the above-mentioned order of processes and can be constructed to allow a computer such as a CPU to execute the method.

The program may be recorded on a recording medium such as a semiconductor memory, a magnetic disk, an optical disk, and a floppy disk (registered trademark) and may be accessed and executed by a computer mounted with the recording medium.

The present application contains subject matter related to that disclosed in Japanese Priority Patent Application JP 2008-295521 filed in the Japan Patent Office on Nov. 19, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A channel selecting device comprising:
a tuner unit performing an automatic scanning process of scanning carrier signals while sequentially shifting a channel-selection frequency in a predetermined frequency range, selecting a broadcast wave signal of the channel-selection frequency corresponding to supplied frequency information, and frequency-converting the broadcast wave signal into an intermediate frequency signal; and
a demodulation unit receiving the intermediate frequency signal from the tuner unit, checking whether a desired carrier exists, setting a carrier frequency as the channel-selection frequency when it is checked that the desired carrier exists, performing a first process of determining whether a current zone is a zone of which a frequency should be set lower than the channel-selection frequency so as to raise the channel-selection frequency and a second process of determining whether the current zone is a zone of which a frequency should be set higher than the channel-selection frequency so as to lower the channel-selection frequency, and setting the channel-selection frequency as a target just-tuning frequency.

2. The channel selecting device according to claim 1, wherein the demodulation unit shifts the frequency to the channel-selection frequency and repeats the processes when it is determined in the first process that the channel-selection frequency should be raised and when it is finally determined in the repeated processes that the channel-selection frequency should not be raised.

3. The channel selecting device according to claim 1, wherein the demodulation unit shifts the frequency to the channel-selection frequency and repeats the processes when it is determined in the second process that the channel-selection frequency should be lowered and when it is finally determined in the repeated processes that the channel-selection frequency should not be lowered.

4. The channel selecting device according to claim 1, wherein the demodulation unit shifts the frequency to the channel-selection frequency and repeats the first process when it is determined in the first process that the channel-selection frequency should be raised and when it is finally determined in the repeated processes that the channel-selection frequency should not be raised, and performs the second process when it is finally determined that the channel-selection frequency should be raised, and wherein the demodulation unit shifts the frequency to the channel-selection frequency and repeats the second process when it is determined in the second process that the channel-selection frequency should be lowered and when it is finally determined in the repeated processes that the channel-selection frequency should not be lowered, and sets the channel-selecting frequency as the just-tuning frequency when it is finally determined that the channel-selection frequency should be lowered.

5. The channel selecting device according to claim 1, wherein the demodulation unit shifts the frequency to the channel-selection frequency and repeats the second process when it is determined in the second process that the channel-selection frequency should be lowered and when it is finally determined in the repeated processes that the channel-selection frequency should not be lowered, and sets the channel-selecting frequency as the just-tuning frequency when it is finally determined that the channel-selection frequency should be lowered.

6. A channel selecting method comprising the steps of:
   allowing a tuner unit, which performs an automatic scanning process of scanning carrier signals while sequentially shifting a channel-selection frequency in a predetermined frequency range, to select a broadcast wave signal of the channel-selection frequency corresponding to supplied frequency information and to frequency-convert the broadcast wave signal into an intermediate frequency signal;
   setting a carrier frequency as the channel-selection frequency when it is checked that a desired carrier exists on the basis of the intermediate frequency signal;
   performing a first process of determining whether a current zone is a zone of which a frequency should be set lower than the channel-selection frequency so as to raise the channel-selection frequency and a second process of determining whether the current zone is a zone of which a frequency should be set higher than the channel-selection frequency so as to lower the channel-selection frequency; and
   setting the channel-selection frequency as a target just-tuning frequency after the processes.

7. A non-transitory computer-readable medium including a program, which when executed by a computer, causes the computer to execute a channel selecting method comprising the steps of:
   allowing a tuner unit, which performs an automatic scanning process of scanning carrier signals while sequentially shifting a channel-selection frequency in a predetermined frequency range, to select a broadcast wave signal of the channel-selection frequency corresponding to supplied frequency information and to frequency-convert the broadcast wave signal into an intermediate frequency signal;
   setting a carrier frequency as the channel-selection frequency when it is checked that a desired carrier exists on the basis of the intermediate frequency signal;
   performing a first process of determining whether a current zone is a zone of which a frequency should be set lower than the channel-selection frequency so as to raise the channel-selection frequency and a second process of determining whether the current zone is a zone of which a frequency should be set higher than the channel-selection frequency so as to lower the channel-selection frequency; and
   setting the channel-selection frequency as a target just-tuning frequency after the processes.

* * * * *